(12) United States Patent
Chang et al.

(10) Patent No.: US 8,877,323 B2
(45) Date of Patent: Nov. 4, 2014

(54) SEMICONDUCTOR STRUCTURES AND METHOD FOR FABRICATING THE SAME

(75) Inventors: Tsung-Chieh Chang, Sinshih Township, Tainan County (TW); Ching-Hung Ko, Sinshih Township, Tainan County (TW); Mu-Jia Liu, Sinshih Township, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 411 days.

(21) Appl. No.: 12/956,209

(22) Filed: Nov. 30, 2010

(65) Prior Publication Data

US 2012/0135201 A1    May 31, 2012

(51) Int. Cl.
| | | |
|---|---|---|
| B32B 3/20 | (2006.01) | |
| B32B 3/00 | (2006.01) | |
| B32B 27/14 | (2006.01) | |
| H01L 23/00 | (2006.01) | |
| B32B 7/14 | (2006.01) | |
| B32B 17/06 | (2006.01) | |
| B32B 37/12 | (2006.01) | |

(52) U.S. Cl.
CPC ............... *B32B 7/14* (2013.01); *H01L 2224/94* (2013.01); *H01L 24/13* (2013.01); *H01L 2224/13099* (2013.01); *H01L 24/94* (2013.01); *H01L 2224/81139* (2013.01); *H01L 2224/81201* (2013.01); *H01L 2224/81191* (2013.01); *H01L 2224/1319* (2013.01); *B32B 2457/14* (2013.01); *B32B 17/06* (2013.01); *H01L 2224/1163* (2013.01); *H01L 2224/16227* (2013.01); *B32B 37/12* (2013.01); *H01L 2224/13082* (2013.01); *H01L 2224/8134* (2013.01); *B32B 2313/00* (2013.01); *H01L 2224/11436* (2013.01); *H01L 2224/1601* (2013.01); *H01L 24/81* (2013.01); *H01L 24/16* (2013.01); *H01L 2224/10135* (2013.01)
USPC ............................ 428/188; 428/166; 428/198

(58) Field of Classification Search
USPC .......................................... 428/166, 198, 188
See application file for complete search history.

(56) References Cited

U.S. PATENT DOCUMENTS

| | | | |
|---|---|---|---|
| 7,433,555 B2 * | 10/2008 | Lee et al. .......................... 385/14 |
| 2007/0075236 A1 * | 4/2007 | Chen et al. ..................... 250/239 |
| 2009/0121300 A1 * | 5/2009 | Voelz ............................. 257/432 |

FOREIGN PATENT DOCUMENTS

JP              2002231919 A   *   8/2002

OTHER PUBLICATIONS

English translation of JP 2002-231919 published Aug. 16, 2002.*

* cited by examiner

*Primary Examiner* — Catherine A Simone
(74) *Attorney, Agent, or Firm* — McClure, Qualey & Rodack, LLP

(57) ABSTRACT

A semiconductor structure is provided. The semiconductor structure includes a first substrate, a second substrate opposite to the first substrate, a plurality of spacers disposed between the first substrate and the second substrate, and an adhesive material bonded with the first substrate and the second substrate within the two adjacent spacers. The invention also provides a method for fabricating the semiconductor structure.

6 Claims, 6 Drawing Sheets

SEMICONDUCTOR STRUCTURES AND METHOD FOR FABRICATING THE SAME

BACKGROUND OF THE INVENTION

1. Field of the Invention

The invention relates to a semiconductor structure, and more particularly to a semiconductor structure with a spacer disposed between substrates and a fabrication method thereof.

2. Description of the Related Art

A conventional method of bonding is disclosed as follows. First, a photo-sensitive material is applied on a substrate. After photolithography, a patterned photo-sensitive material is formed on the substrate. Another substrate is then bonded to the substrate through the photo-sensitive material. However, the patterned photo-sensitive material with various thicknesses formed by photolithography is non-uniform, thus deteriorating bonding uniformity. Also, the photo-sensitive material is easily deformed (outflow) during the bonding process. Additionally, the bonding force of the photo-sensitive material to the substrates is weak.

Thus, development of a novel bonding method which is able to improve the bonding uniformity and the bonding force between the substrates and prevent material deforming (outflow) is desirable.

BRIEF SUMMARY OF THE INVENTION

One embodiment of the invention provides a semiconductor structure comprising a first substrate, a second substrate opposite to the first substrate, a plurality of spacers disposed between the first substrate and the second substrate, and an adhesive material bonded with the first substrate and the second substrate within the two adjacent spacers.

The first substrate comprises a wafer. The second substrate comprises glass. The spacer comprises plastics. The adhesive material comprises non-photo-sensitive material. The spacers have the same thickness. The thickness of the spacer is similar to that of the adhesive material.

The invention provides a plurality of uniform spacers with the same thickness between substrates to support the substrate during a bonding process such that the gap between the substrates is controlled, effectively improving bonding uniformity. Specifically, due to the disposition of the spacer, an adhesive material is restricted within the two adjacent spacers and thus can be prevented from deforming (outflow). In accordance with various process requirements, the distance between the substrates can be modified by altering the thickness of the spacer. Additionally, the adhesive material has a stronger bonding force than conventional photo-sensitive material to the substrates, facilitating structural stability.

One embodiment of the invention provides a method for fabricating a semiconductor structure comprising providing a first substrate, forming a patterned adhesive material with a plurality of spacers formed thereon on the first substrate, and bonding a second substrate with the first substrate through the adhesive material, wherein the spacers are embedded in the adhesive material such that the adhesive material is within the two adjacent spacers.

The spacer has a width smaller than that of the adhesive material thereunder. The spacers have the same thickness. The thickness of the spacer is similar to that of the adhesive material. The distance between the first substrate and the second substrate is determined by the thickness of the spacer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
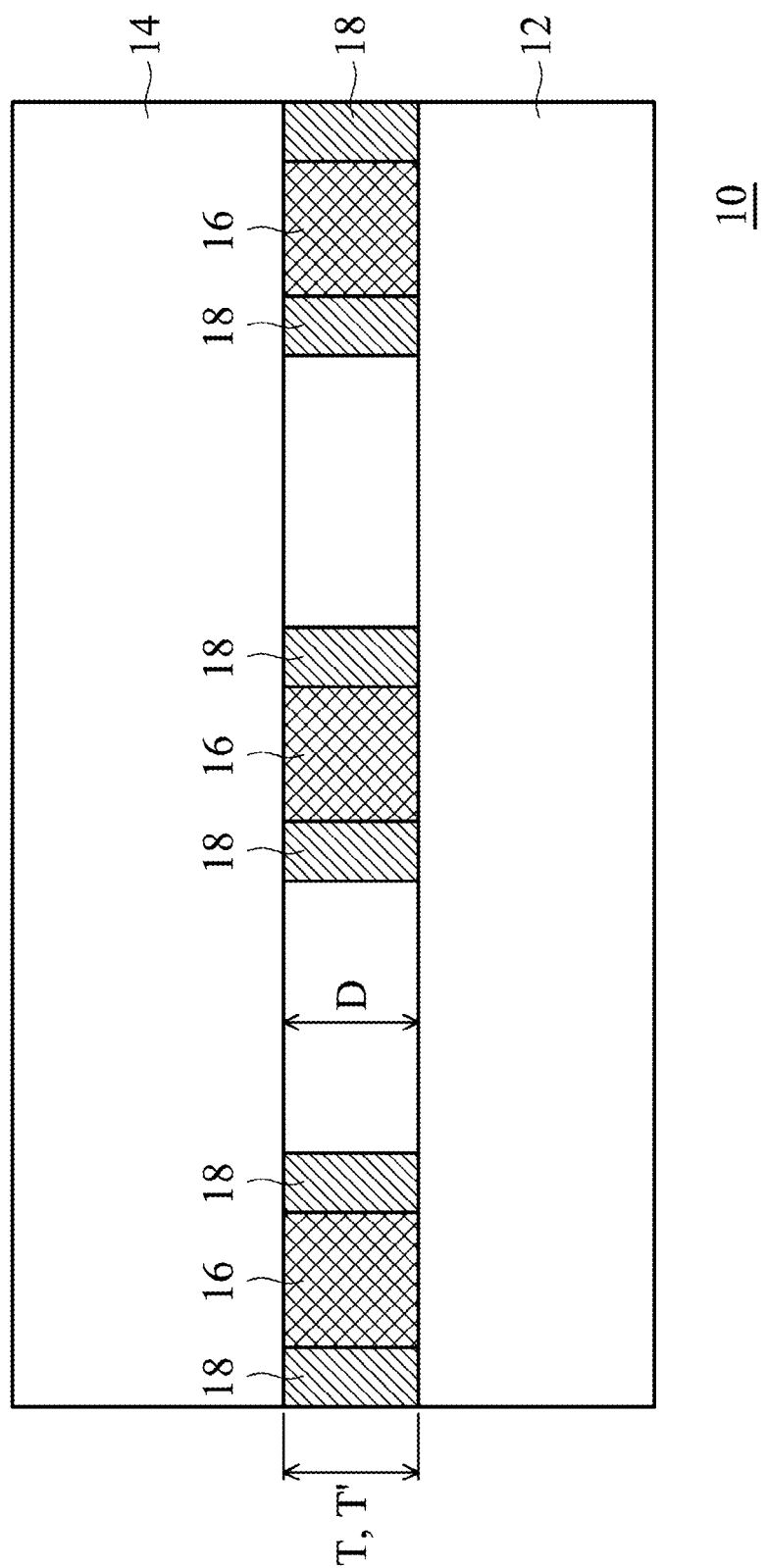
FIG. 1 shows a semiconductor structure according to one embodiment of the invention.
Figure 2:
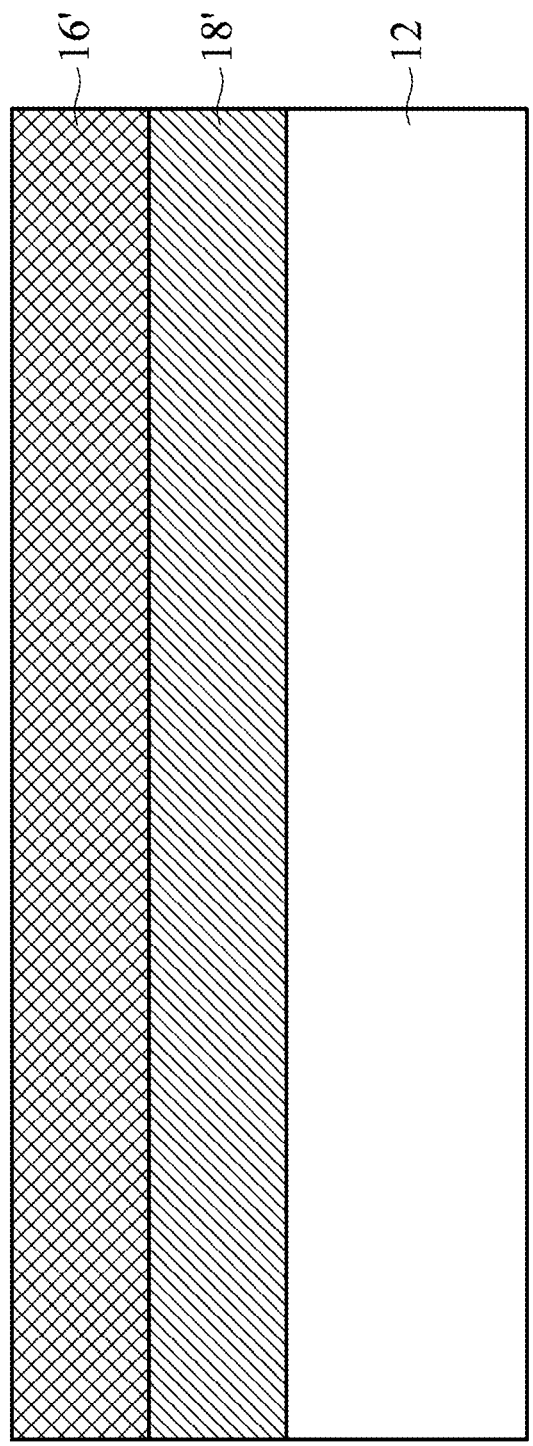
FIGS. 2-6 show a method for fabricating a semiconductor structure according to one embodiment of the invention.

In one embodiment, a semiconductor structure is provided, as shown in FIG. 1. A semiconductor structure 10 comprises a first substrate 12, a second substrate 14, a plurality of spacers 16 and an adhesive material 18. The second substrate 14 is opposite to the first substrate 12. The spacers 16 are disposed between the first substrate 12 and the second substrate 14. The adhesive material 18 is bonded with the first substrate 12 and the second substrate 14 within the two adjacent spacers 16.

The first substrate 12 may comprise a wafer. The second substrate 14 may comprise glass. The spacer 16 may comprise plastics. The adhesive material 18 may comprise non-photo-sensitive material. The spacers 16 have the same thickness T. The thickness T of the spacer 16 is similar to the thickness T' of the adhesive material 18.

Figure 3:
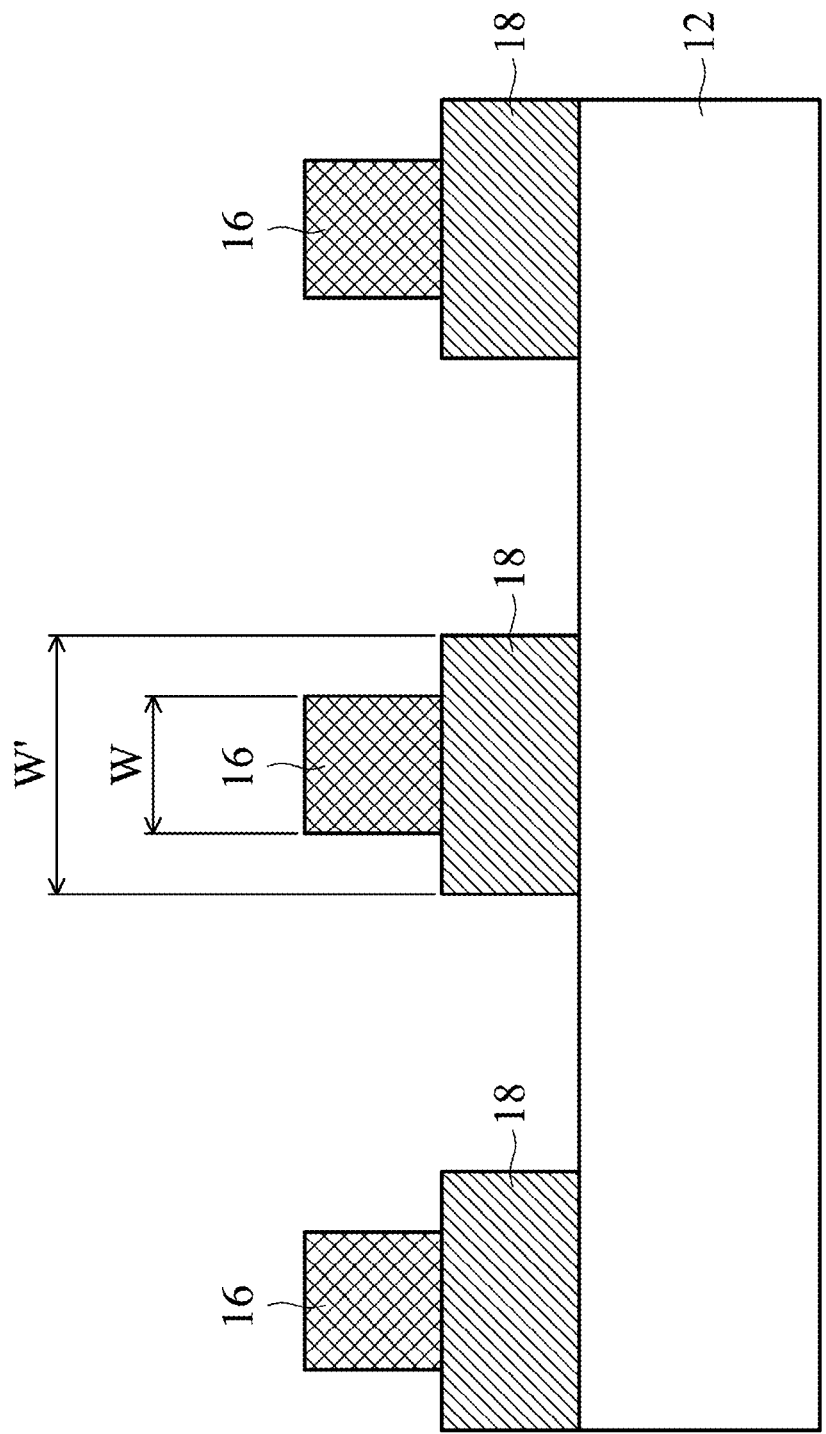

In one embodiment, a method for fabricating a semiconductor structure is provided, as shown in FIGS. 2-6. The method comprises the following steps. First, referring to FIG. 2, a first substrate 12 is provided. An adhesive material 18' with a spacer 16' formed thereon is then pasted on the first substrate 12. Next, the adhesive material 18' and the spacer 16' are patterned by, for example, a laser cutting process, to form a patterned adhesive material 18 with a plurality of spacers 16 formed thereon on the first substrate 12, as shown in FIG. 3. The width W of the spacer 16 is smaller than the width W' of the adhesive material 18 thereunder.

Figure 4:
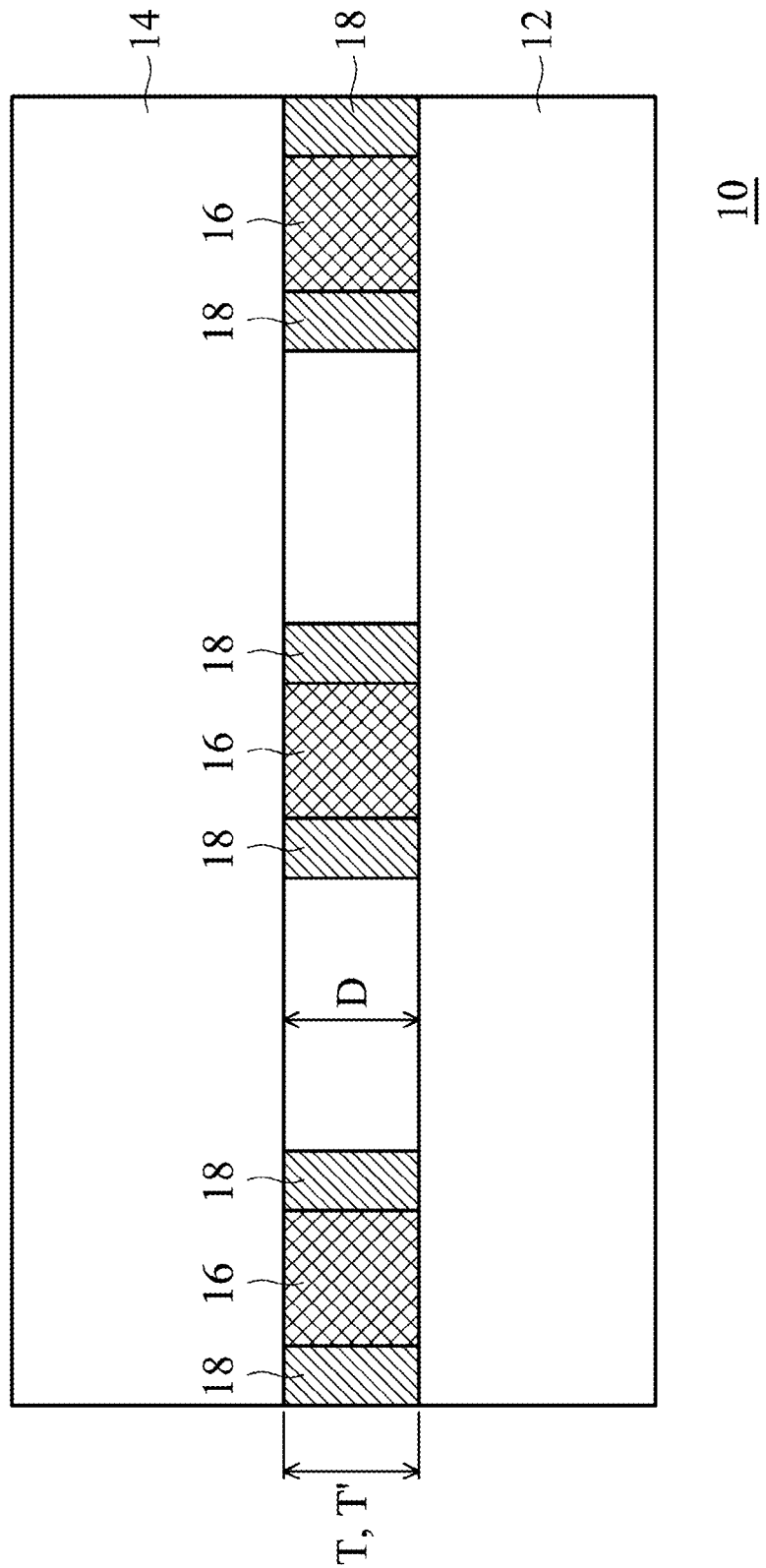

Next, referring to FIG. 4, a second substrate 14 is bonded with the first substrate 12 through the adhesive material 18. Specifically, during the bonding process, the spacers 16 are embedded in the adhesive material 18 such that the adhesive material 18 is within the two adjacent spacers 16. The spacers 16 have the same thickness T. The thickness T of the spacer 16 is similar to the thickness T' of the adhesive material 18. The distance D between the first substrate 12 and the second substrate 14 is determined by the thickness T of the spacer 16.

Figure 5:
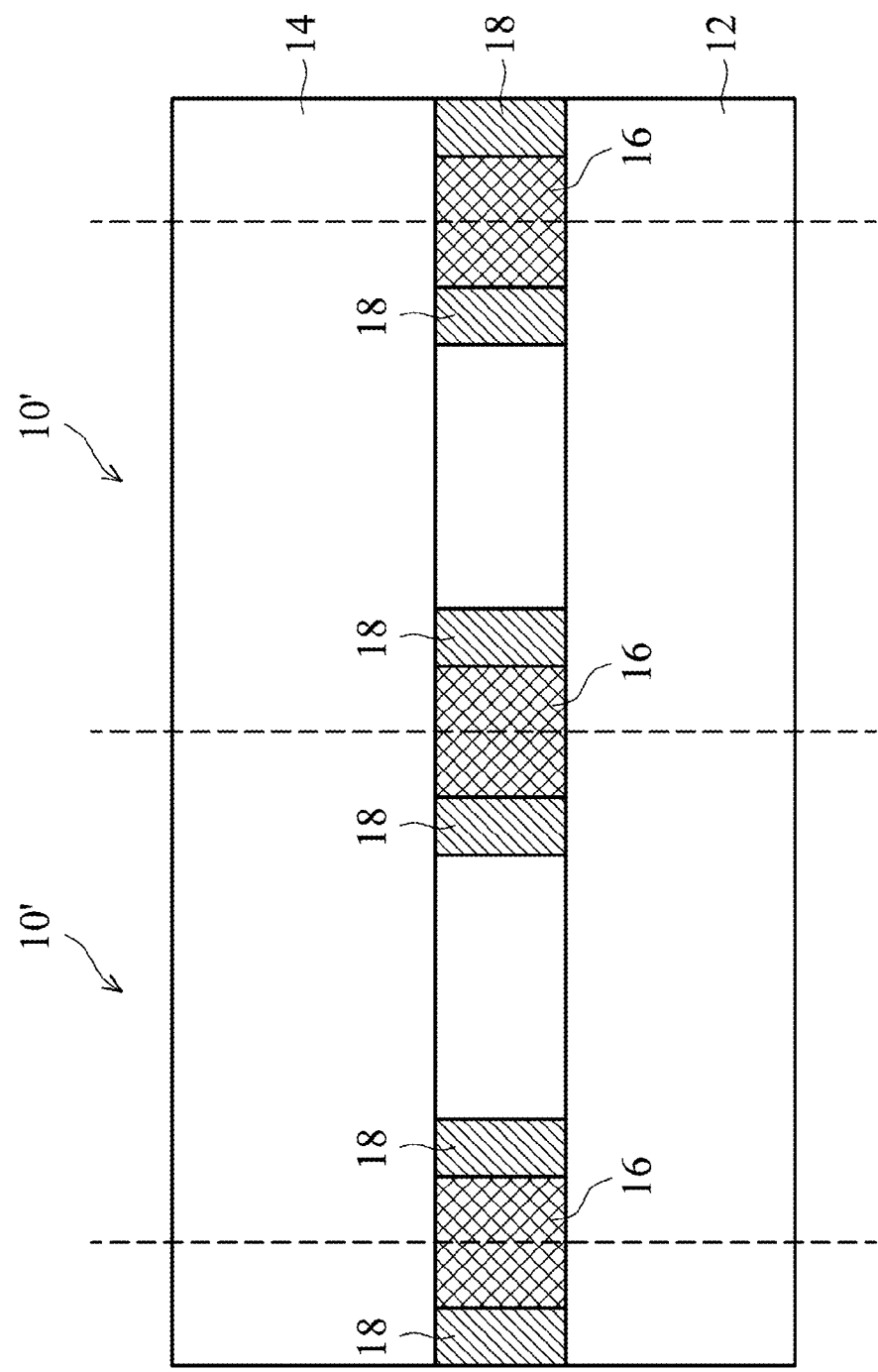
Figure 6:
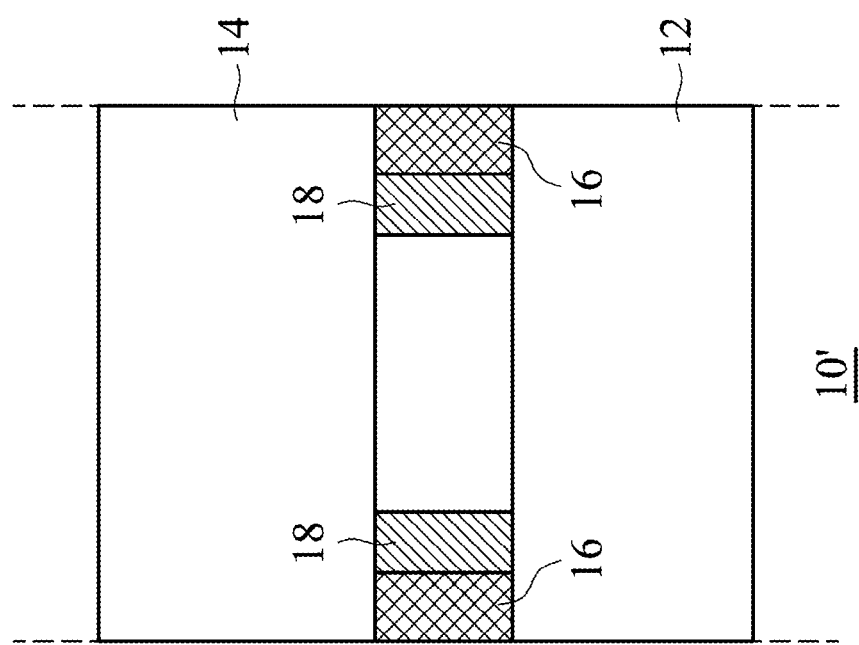

Next, referring to FIG. 5, the semiconductor structure 10 is split from the second substrate 14, the spacers 16 and the first substrate 12 to form single units 10', as shown in FIG. 6.

The invention provides a plurality of uniform spacers with the same thickness between substrates to support the substrate during a bonding process such that the gap between the substrates is controlled, effectively improving bonding uniformity. Specifically, due to the disposition of the spacers, an adhesive material is restricted within the two adjacent spacers and thus can be prevented from deforming (outflow). In accordance with various process requirements, the distance between the substrates can be modified by altering the thickness of the spacer. Additionally, the adhesive material has a stronger bonding force than conventional photo-sensitive material to the substrates, facilitating structural stability.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
a first substrate;
a second substrate opposite to the first substrate;
a plurality of spacers disposed between the first substrate and the second substrate; and
an adhesive material bonded with the first substrate and the second substrate, restricted within the two adjacent spacers, wherein each of the plurality spacers is exposed at sidewalls of the semiconductor structure, and sidewalls of the spacer are aligned with sidewalls of the first substrate and the second substrate.

2. The semiconductor structure as claimed in claim 1, wherein the second substrate comprises glass.

3. The semiconductor structure as claimed in claim 1, wherein the spacer comprises plastics.

4. The semiconductor structure as claimed in claim 1, wherein the adhesive material comprises non-photo-sensitive material.

5. The semiconductor structure as claimed in claim 1, wherein the spacers have the same thickness.

6. The semiconductor structure as claimed in claim 5, wherein the thickness of the spacer is similar to that of the adhesive material.

* * * * *